United States Patent [19]

Maligie

[11] Patent Number: 4,834,821
[45] Date of Patent: May 30, 1989

[54] PROCESS FOR PREPARING POLYMERIC MATERIALS FOR APPLICATION TO PRINTED CIRCUITS

[75] Inventor: William A. Maligie, Mission Viejo, Calif.

[73] Assignee: Morton Thiokol, Inc., Chicago, Ill.

[21] Appl. No.: 141,815

[22] Filed: Jan. 11, 1988

[51] Int. Cl.$^4$ ............ B44C 1/17; B44C 1/22; B32B 31/00
[52] U.S. Cl. .................... 156/152; 156/231; 156/238; 156/248; 156/267; 156/660; 428/202; 427/96
[58] Field of Search ............ 156/630, 659.1, 660, 156/661.1, 152, 230, 231, 235, 233, 238, 240, 246, 247, 261, 257, 267, 268, 364, 344; 427/96, 272, 282; 118/213; 174/68.5; 100/93 P; 430/260, 262, 271; 428/41, 201, 202, 352; 204/15, 16; 29/424

[56] References Cited

U.S. PATENT DOCUMENTS

| | | | |
|---|---|---|---|
| 2,861,029 | 11/1958 | Bain, Jr. et al. | 204/15 |
| 2,874,085 | 2/1959 | Brietzke | 430/260 |
| 2,990,282 | 6/1961 | Wicke | 430/260 |
| 3,152,938 | 10/1964 | Osifchin et al. | 156/660 |
| 3,181,986 | 5/1965 | Pritikin | 156/233 |
| 3,290,191 | 12/1966 | Davis | 156/660 |
| 3,331,726 | 7/1967 | McGinley et al. | 156/510 |
| 3,451,902 | 6/1969 | Levinos | 204/15 |
| 3,475,284 | 10/1969 | Olson | 204/15 |
| 3,508,983 | 4/1970 | Origer et al. | 156/630 |
| 3,547,629 | 12/1970 | Kinney et al. | 427/96 |
| 3,573,975 | 4/1971 | Dhaka et al. | 427/96 |
| 3,574,026 | 4/1971 | Kucheck | 156/152 |
| 3,663,376 | 5/1972 | Uchytil et al. | 204/15 |
| 3,678,577 | 10/1972 | Weglin | 174/68.5 |
| 3,713,944 | 1/1973 | Dennis et al. | 156/261 |
| 3,730,812 | 5/1973 | Prisk et al. | 428/480 |
| 3,772,161 | 11/1973 | Bogard et al. | 204/15 |
| 3,911,716 | 10/1975 | Weglin | 174/68.5 |
| 3,956,041 | 5/1976 | Polichette et al. | 156/238 |
| 3,990,142 | 11/1976 | Weglin | 174/68.5 |
| 4,053,348 | 11/1977 | Weglin | 156/661.1 |
| 4,127,436 | 11/1978 | Friel | 156/238 |
| 4,193,341 | 3/1980 | Clements et al. | 100/93 |
| 4,230,793 | 10/1980 | Losert et al. | 427/96 |
| 4,294,650 | 10/1981 | Werthman | 156/660 |
| 4,313,995 | 7/1981 | Delgadillo | 428/41 |
| 4,321,105 | 3/1982 | Melonio et al. | 156/660 |
| 4,392,909 | 7/1983 | Bohn et al. | 174/68.5 |
| 4,397,704 | 8/1983 | Frick | 156/267 |
| 4,421,589 | 12/1983 | Armini et al. | 100/93 P |
| 4,465,538 | 8/1984 | Schmook | 156/233 |
| 4,466,849 | 8/1984 | Dantsker | 156/344 |
| 4,487,654 | 12/1984 | Coppin | 204/15 |
| 4,512,854 | 4/1985 | Grah | 204/15 |
| 4,557,792 | 12/1985 | Yamada et al. | 100/93 P |
| 4,574,031 | 3/1986 | Dorey et al. | 427/96 |
| 4,584,767 | 4/1986 | Gregory | 174/68.5 |
| 4,606,787 | 8/1986 | Pelligrino | 156/630 |
| 4,680,079 | 7/1987 | Tanaka | 156/364 |

Primary Examiner—Michael W. Ball
Assistant Examiner—Louis Falasco
Attorney, Agent, or Firm—Gerald K. White

[57] ABSTRACT

A process for preparing curable, aqueous strippable, polymeric materials for application, in succession, as masks, to a specific area of each of a plurality of printed circuit boards that is to be protected from the stripping and plating processes associated with gold finger plating, during the fabrication thereof, includes forming a coating of substantially identical, uniformly spaced, areas of polymeric material on a continuous length of carrier web, applying a cover coating over the carrier web and the uniformly spaced areas of polymeric material with the cover coating having a width substantially the same as that of the carrier film, and winding up in a roll the continuous length of carrier web and the cover coating with the uniformly spaced polymeric material sandwiched therebetween.

18 Claims, 4 Drawing Sheets

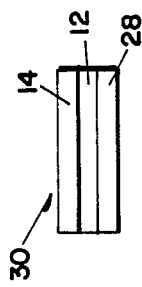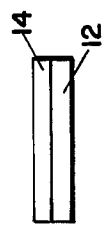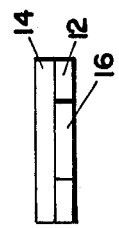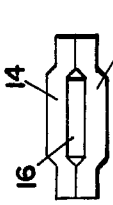
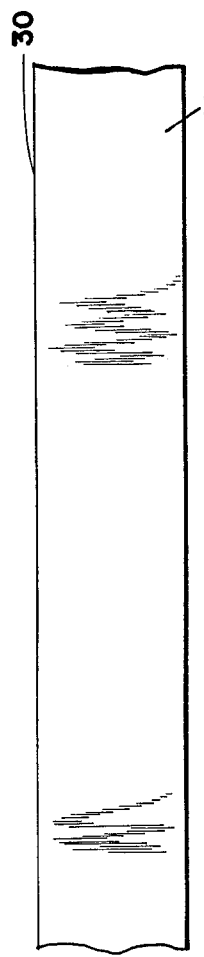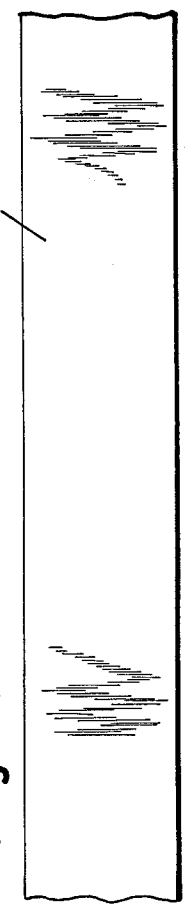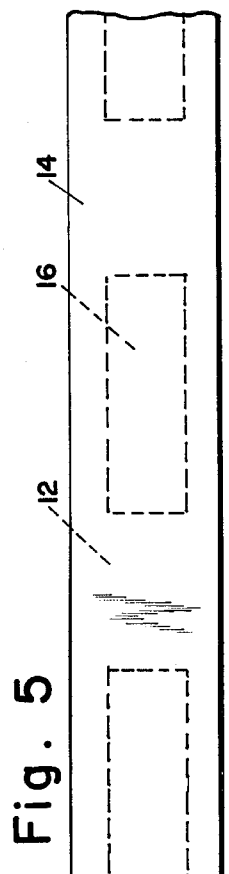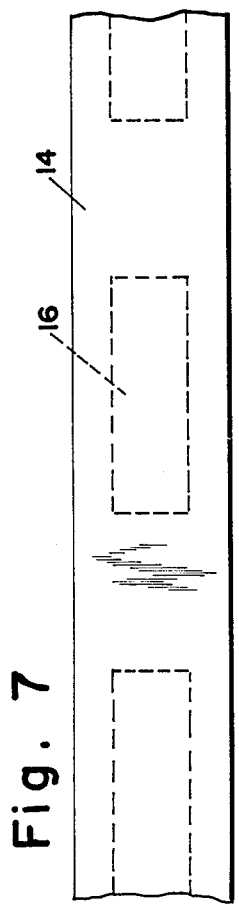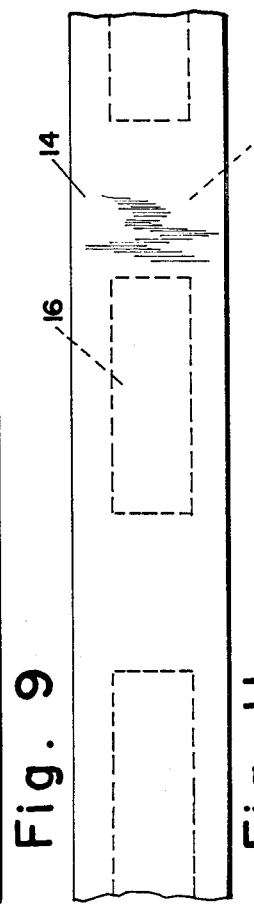

PROCESS FOR PREPARING POLYMERIC MATERIALS FOR APPLICATION TO PRINTED CIRCUITS

BACKGROUND OF THE INVENTION

1. Field of the Invention

This invention relates to the application of a heat or photosensitive polymeric material to a printed circuit board, semiconductor wafer, semiconductor lead frame, or electronic packaging.

2. Description of the Prior Art

Prior to electroplating or stripping operations in the manufacture of printed circuit boards, it is the current practice in the art to partially cover the surfaces of the circuit boards or other substrates with a masking tape. The masking tape comprises a foil-like carrier that is made of a material such as paper or plastic and a coating of an adhesive material applied to one side of the carrier, which carrier may be self-adhesive or adhered to the circuit board by a pressure or heat activation process.

Such masking tapes serve the purpose of protecting and thereby preserving intact, during plating and stripping operations, predetermined portions of circuit boards. For example, during the plating of gold on the fingers or edges of a circuit board, the areas, which are not to be stripped of tin/lead and subsequently gold plated, are protected from the stripping and plating baths by a pressure sensitive tape commonly known as "platers tape."

Many problems are encountered in the use of such a tape and tape masking process. These problems include the following:

1. The tape is manually applied. The application of a tape product manually is cumbersome and non-automatable.
2. The tape is hand-stripped or mechanically removed which tends to produce defect-causing "nicks" in the printed circuit board.
3. The residual adhesive usually left behind by the pressure sensitive tape must be removed with an organic solvent. Typically, in printed circuit facilities, several operators are stationed at the end of the gold plating line. Their major function is to manually remove the platers tape and then apply organic solvents in an effort to remove the adhesive residue. Reliability problems may result if all the residue is not removed.
4. The organic solvents required to remove the residual adhesive causes ionic contamination problems on the surface of the circuit board and are possibly hazardous to the health of personnel engaged in the handling thereof. There is a movement in U.S. industry which is lobbying for reducing worker contact with organic solvents like M.E.K., 1,1,1, trichlorethane, industrial alcohols, and methylene chloride because of their potentially adverse health effects.
5. Organic solvents, such as methylene chloride, used to remove the tape residue, can also remove or soften the epoxy resin which is on the surface of the circuit board.
6. Platers tape does not conform well to the circuit trace geometries. As a result, plating and stripping bath chemicals can wick under the tape to cause uneven plating.
7. Plating bath chemicals which wick under the tape can be released in subsequent baths resulting in cross contamination.
8. The adhesive tape process is labor intensive, and therefore, expensive.

Thus, there is a need for improvement in the materials used and the method of their application to predetermined portions of the surfaces of circuit boards, which portions must be protected from the stripping and plating processes associated with gold finger plating. The present invention was devised to fill the gap that has existed in the art in these respects.

SUMMARY OF THE INVENTION

An object of the invention is to provide an improved process for producing masks on printed circuit boards and other substrates which avoids the aforementioned problems that have been encountered in the prior art.

Another object of the invention is to provide a process for preparing a curable, aqueous strippable, dry film for application, in succession, to a specific area of each of a plurality of circuit boards that are to be protected from the stripping and plating processes associated with gold finger plating. The aqueous strippable dry film may also be used to protect the gold plated fingers during flow solder assembly of the circuit boards.

A more specific object of the invention is to provide a process for producing masks on printed circuits by applying a curable dry film of polymeric material to the area of the printed circuit to be protected, wherein the improvement comprises:

(a) forming on a carrier web a curable film of polymeric material having an area corresponding to the area of the printed circuit to be protected, said dry film of polymeric material being peelable from the carrier web, (b) applying the dry film of polymeric material to the printed circuit by conveying the printed circuit beneath the web with the dry film of polymeric material facing the printed circuit and in alignment therewith;

(c) affixing the dry film of polymeric material to the area of the printed circuit to be protected by pressing the carrier web and dry film of polymeric material against the printed circuit by means of an elastomeric pad having a surface region for contacting the carrier web; and (d) peeling the carrier web away from the printed circuit.

In accomplishing these and other objectives of the invention, there is provided a process involving die cutting and ladder stripping from a continuously moving carrier web having a film of heat sensitive or photopolymeric material formed thereon, thereby to produce a formation on the web comprising a succession of uniformly spaced pieces, islands or areas of the polymeric film, all of which areas may be of the same size and correspond to each of the areas of a plurality of printed circuit portions to be protected.

A particularly advantageous form of such dry film photopolymeric material, that is available commercially under the trademark "LAMINAR," is disclosed in U.S. Pat. No. 3,887,450 entitled "PHOTOPOLYMERIZABLE COMPOSITIONS CONTAINING POLYMERIC BINDING AGENTS," granted on June 3, 1975, to Michael N. Gilano and assigned to Morton Thiokol, Inc., the owner of the above-mentioned trademark and the assignee of the present invention. This dry film polymeric material is characterized in that it can be readily developed by means of an alkaline aqueous solution to yield a resist which when exposed to actinic light is impervious to conventional plating solutions but which is aqueous strippable.

As manufactured, the resist is in the form of a thin dry film or coating of polymeric material on a carrier polyester support web. Although tacky, the dry film is "peelable." This makes it possible to employ a typical 3-layer construction for the resist, involving a polyethylene cover film for protection of the dry film and to facilitate handling thereof.

In accordance with the invention, a film of dry polymeric material is applied to an associated one of the predetermined printed circuit portions to be protected by conveying the printed circuits beneath the carrier web with the dry film of polymeric material facing the printed circuits and moved into alignment with each, in turn. The dry film of polymeric material is affixed to each of the areas of the printed circuits to be protected by pressing the carrier web of dry film of polymeric material against the printed circuit, then in alignment therewith, by means of an elastomeric pad having a surface region for contacting the carrier web. The carrier web is peeled away from each of the printed circuits as each, in its turn, has had the dry film of polymeric material so applied thereto.

The various features of novelty which characterize the invention are pointed out with particularity in the claims annexed to and forming a part of this specification. For a better understanding of the invention, its operating advantages, and specific objects attained by its use, reference is made to the accompanying drawings and descriptive matter in which a preferred embodiment of the invention is illustrated.

BRIEF DESCRIPTION OF THE DRAWINGS

With this description of the invention, a detailed description follows with reference being made to the accompanying figures of drawing which form part of the specification, in which like parts are designated by the same reference numbers, and of which:

FIGS. 3, 5, 7, 9 and 11 are top plan views and FIGS. 4, 6, 8, 10 and 12 are respectively corresponding cross-sectional end views of a commercially available dry film polymeric material at various stages of processing in accordance with the invention;

DESCRIPTION OF THE PREFERRED EMBODIMENT

Figure 1:
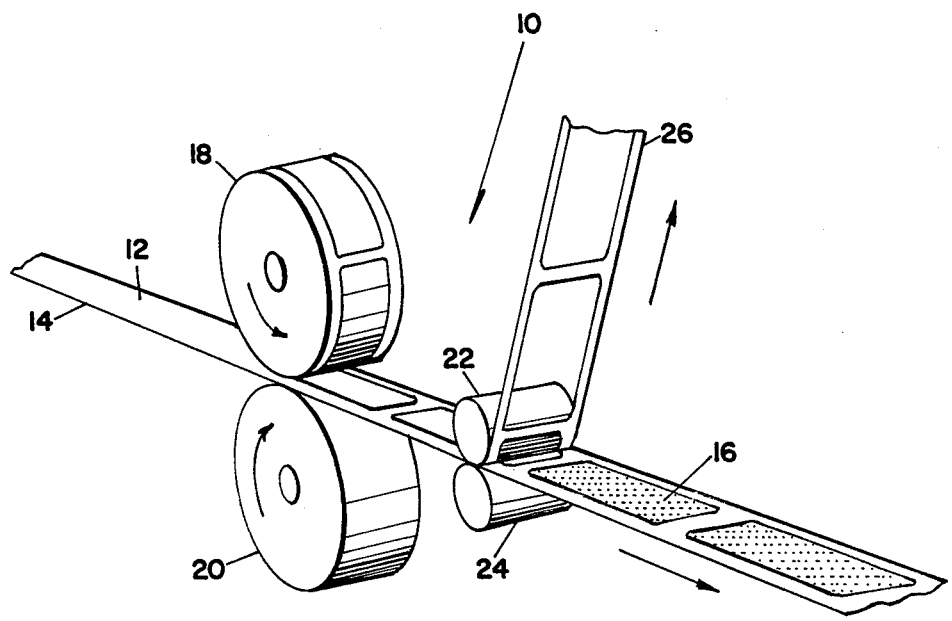
FIG. 1 is an illustration, in perspective view, of apparatus for producing precision positioned, uniformly spaced, areas, pieces or "islands" of dry film of polymeric material of the same size on a carrier film.

FIG. 1 illustrates an apparatus 10 for die cutting and stripping dry film of polymeric material 12 from an elongated carrier web 14 in the production of precision positioned separate, uniformly spaced, pieces, areas, or islands 16 of dry film of the same size on the carrier web 14. The apparatus, as shown, comprises a rotary die 18 and an associated backing roller or anvil 20, which are suitably supported for rotation in opposite directions (by means not shown), with peripheral surfaces thereof in close proximity to and engaging adjacent surfaces of the dry film polymeric material 12 and carrier web 14, respectively. Turn rollers 22 and 24 suitably mounted for rotation (by means not shown) and engaging the dry film of polymeric material 12 and carrier web 14, respectively, are provided for enabling the dry film waste portion, designated 26, to be stripped away. The waste portion 26, as shown in FIG. 1, is in the form of a ladder.

Figure 2:
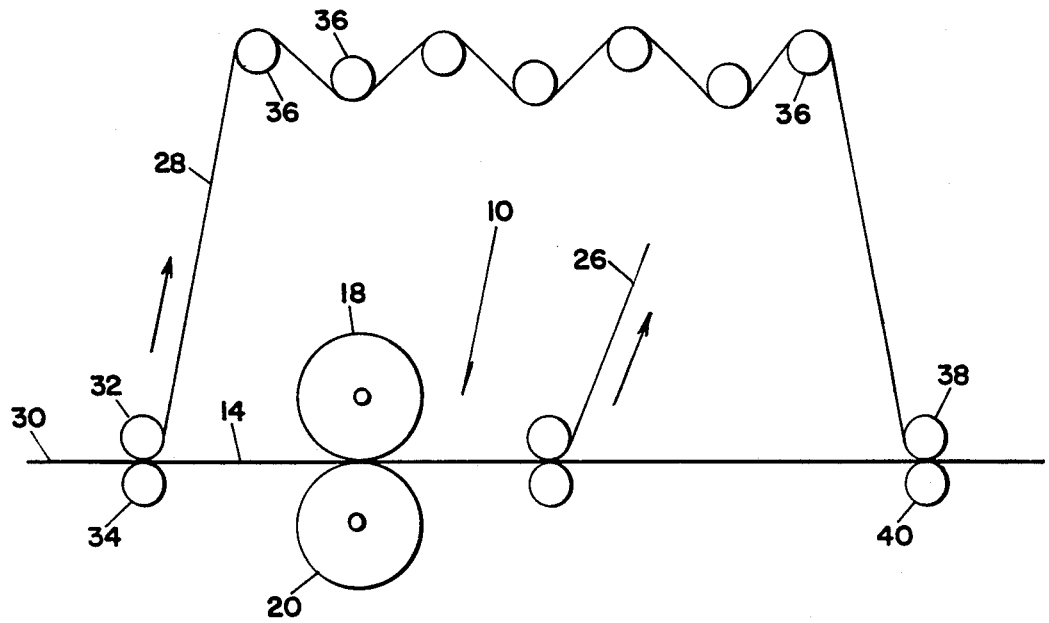
FIG. 2 schematically illustrates an apparatus including the apparatus of FIG. 1 for processing a commercially available dry film of polymeric material in accordance with the invention.

FIG. 2 schematically illustrates an apparatus, which incorporates the die cutting and stripping apparatus of FIG. 1, for preparing a curable dry film of polymeric material in accordance with the invention. FIGS. 3 through 12 further illustrate the process at various stages thereof.

Referring to FIGS. 3 and 4, the dry film of polymeric material 12 is shown coated on the carrier support web 14 and provided with a protective cover coating 28 of polyethylene, thereby forming a 3-layer composite construction designated 30. Such a composite film construction 30, as above mentioned, is available commercially. In FIG. 2, the composite film material 30, after being unwound from a standard core (not shown), is shown as being passed between turn rollers 32 and 34 which are suitably supported for rotation (by means not shown). At the turn rollers 32 and 34 the polyethylene protective coating 28 is stripped from the material 30 and passed over several overhead guide rollers 36. The film material 30 with the polyethylene cover coating 28 stripped away, as shown in FIGS. 2, 5 and 6, is then passed between the rotary-die 18 and anvil 20 where the dry film polymeric material 12 is cut into separate, uniformly spaced areas 16, as shown in FIGS. 7 and 8. FIGS. 9 and 10 show the film material 30 with the polyethylene cover coating 28 and also the waste dry film portion 26 of polymeric material stripped away, the portion 26 being stripped away at the turn rollers 22 and 24. After passing through the turn rollers 22 and 24 and having the waste portion 28 of polymeric material stripped away, as seen in FIG. 2, the carrier web 14 with the spaced areas 16 of dry film polymeric material thereon passes between turn rollers 38 and 40 where the polyethylene cover coating 28 is recombined, that is relaminated, with the carrier web 14 and the spaced areas 16 of the film of polymeric material. This reforms the 3-layer construction and encases the spaced areas 16 of dry polymeric film between the carrier web 14 and polyethylene protective coating 28, as shown in FIGS. 11 and 12.

Further, in accordance with the invention, the relaminated and reformed 3-layer film composite construction may be rolled onto a standard diameter core, boxed in single or multiple rolls, and readied for shipment.

Figure 13:
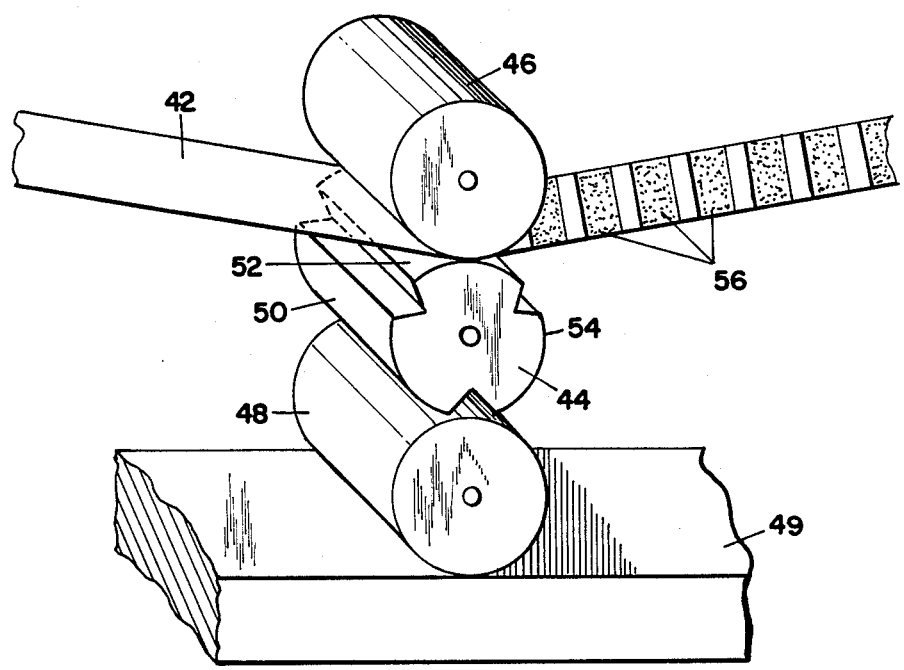
FIG. 13 is an illustration, in perspective view, of an apparatus embodiment alternative to that shown in FIG. 1 for producing precision positioned, separate, uniformly spaced, areas of polymeric material of the same size on a carrier film.

In FIG. 13 there is illustrated, in perspective view, another embodiment of the invention comprising a one-step method for creating resist patterns on a carrier support web or film backing which can then be laminated to any suitable substance. Referring to FIG. 13, an uncoated carrier web or film backing 42, which may be made of polyester, is passed between a pattern application roller 44 and a backing roller 46 with the rollers 44 and 46 engaging directly opposite sides of the web 42. Pattern application roller 44 also is in engagement with a resist pickup roller 48 which, in turn, is in contact with a solution/resist reservoir 49. The rollers 44, 46 and 48 are all suitably mounted for rotation on shafts (not shown) which are all positioned in the same plane, one above the other.

As shown in FIG. 13, the pattern application roller 44 is characterized in having a plurality of circumferential pattern application surfaces 50, 52 and 54 which are of the same circumferential length and are equally spaced apart about the periphery of the roller 44.

In the operation of the embodiment of FIG. 13, rotation of the pattern application roller 44 into contact with the resist pick-up roller 48 is operative to transfer liquid polymeric material thereto from the solution/resist reservoir 49, which liquid polymeric material, in turn, is transferred to the carrier web 42 to form a succession of precision positioned and uniformly spaced areas or islands 56 on the carrier web 44, all of which areas 56 are of the same size.

Although not shown, it will be understood that a polyethylene cover film may be laminated to the carrier web 42 and spaced areas 56 for the protection of the latter and to facilitate handling thereof.

As those skilled in the art will understand, a succession of equally sized, precision positioned, and uniformly spaced areas or islands of a film of polymeric material 56 may be formed on a carrier web 42 of polyester or other suitable material by other methods such as the known silk-screen process and the known rotogravure process.

Figure 14:
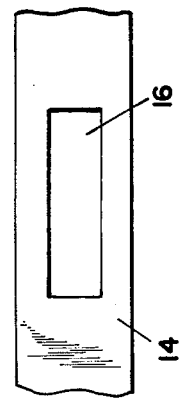
Figure 15:
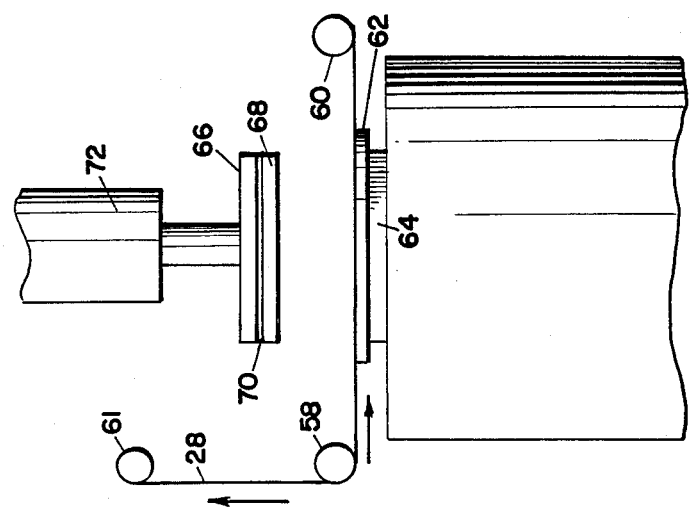

The manner of affixing the dry film of polymeric material to a portion of a circuit board to be protected is illustrated by reference to FIGS. 14–19. Thus, FIG. 14 shows an area of polymeric material 16 on a carrier web 14, with the carrier web 14, as shown in FIG. 15, extending from a feed roll 58 to a take-up roll 60. Also as shown in FIG. 15 the polyethylene cover coating 28 is peeled from the feed roll 58 and wound up on a polyethylene take up roll 61. An exposed area of the polymeric material 16 is brought into position immediately above, adjacent and in alignment with a portion of a printed circuit board 62 to be protected. The printed circuit board 62 rests on a stationary platen 64.

Figure 20:
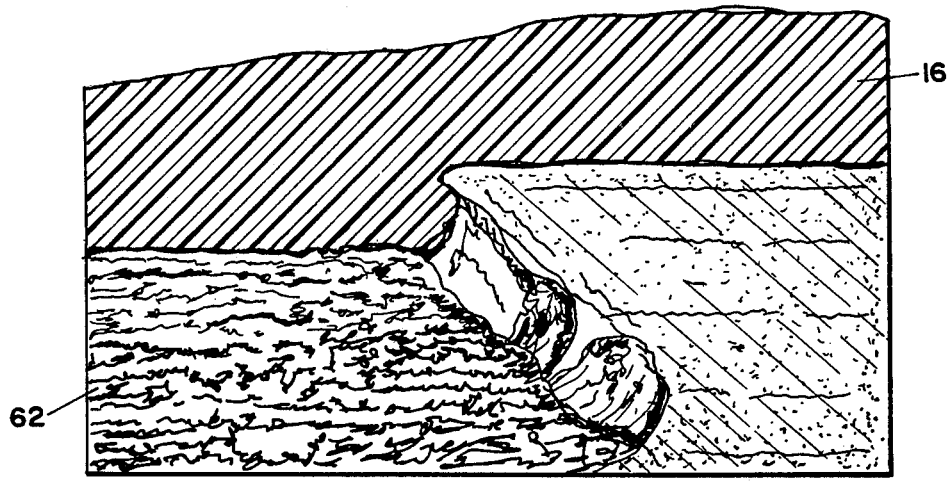
FIG. 20 is a greatly enlarged perspective view as seen under a scanning electron microscope of the manner in which the dry film polymeric material drapes over the printed circuit board electrically conductive elements, in sealing contact therewith.
Figure 18:
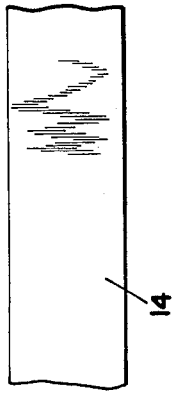
FIGS. 14, 16 and 18 and respectively associated FIGS. 15, 17 and 19 collectively illustrate a method of affixing the dry film of polymeric material to a printed circuit board.

Positioned above the platen 64 is a vertically movable heated platen 66 having an elastomeric pad 68 affixed thereto that provides a surface region for contacting the carrier web 14. The pad 68 is backed by a rigid surface 70 and has a shape and size corresponding to the shape and size of the area of polymeric material 16 to be affixed to the circuit board 62. The use of an elastomeric pad 68 backed by the rigid surface 70 enables the application of uniform pressure and temperature to the circuit board 62 or other substrate with a regular or irregular surface. By irregular surface is meant a surface including areas of nonplanar geometry, an example of which is the printed circuit electrically conductive elements that project outwardly from the surface of a printed circuit board. There is provided a consistent and uniform pressure to irregular surfaces because the elastomeric pad is soft enough, preferably having a durometer in the range of 40–60, to act similarly to a fluid providing equal and opposite pressure to the entire surface under the surface area of the elastomer pad 68, laterally as well as in the direction of pressure application. As a result of such pressure on the entire surface under the pad 68, the dry polymeric film material 16 is pressed into conforming and sealing relationship with not only the circuit board 62 but also with the electrically conductive circuit elements being protected, as illustrated in FIG. 20.

Figure 19:
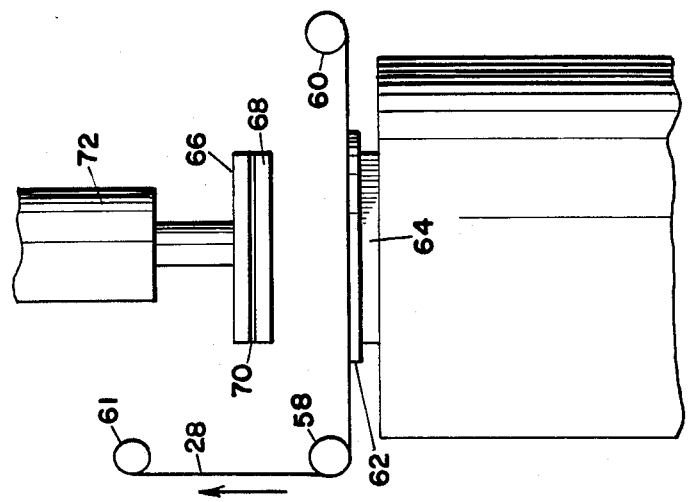
Figure 17:
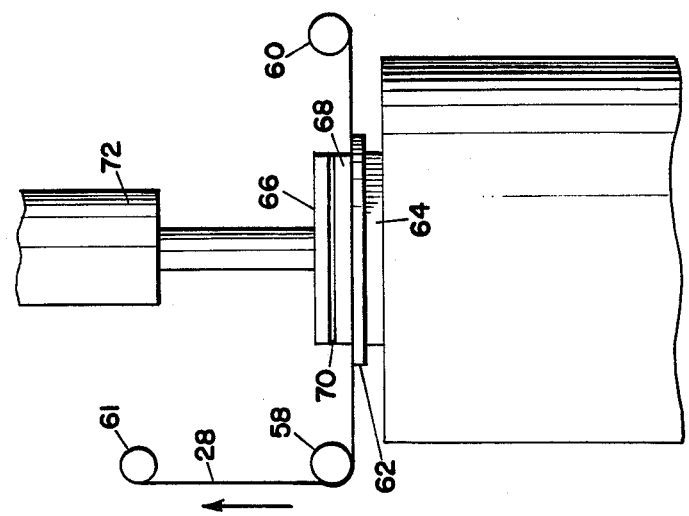

Heated platen 66 is movable between an "Up" position as shown in FIGS. 15 and 19 and a "Down" position, as shown in FIG. 17, by motive means 72. The motive means 72 per se forms no part of the present invention, and therefore, will not further be described herein.

Figure 16:
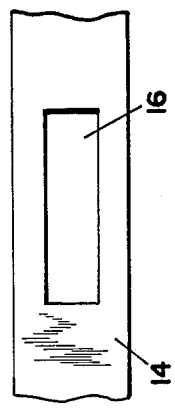

When moved from the "Up" position to the "Down" position, as shown in FIG. 17, and with the film of polymeric material 16 positioned, as shown in FIG. 16, the elastomeric pad 68 carried by the heated platen 64 presses the carrier web 14 and thereby the area of polymeric material 16 against the printed circuit board 62. This affixes the polymeric material to the printed circuit board 62. At the end of a suitable time interval, the heated platen 66 is moved by the motive means 72 to the "Up" position, as shown in FIG. 19. The absence of the area 16 in FIG. 18 indicates that the area 16 has been fastened to the circuit board 62 as a mask.

While the heated platen 66 is held in the "Up" position, the carrier web 14 is wound up on the takeup roll 60, thereby peeling the web 14 away from the circuit board 62 and advancing the carrier web 14 to bring the next area of polymeric material 16 thereon into proper alignment for placing a protective mask on the next circuit board 62. Following this or concurrently therewith, the circuit board 62 upon which a protective mask has been placed, is replaced with such next circuit board 62. This sets the stage for the beginning of another cycle, as shown in FIG. 15.

Thus, in accordance with the invention, there has been provided a unique process for preparing a curable, aqueous processable, dry film for application to a specific area of a circuit board, that area being the portion of the circuit board which must be protected from the stripping and plating processes associated with gold finger plating. The process has utility also for protecting the gold plated fingers during flow solder assembly. The process is particularly suited for tab finger plating, semiconductor wafer processing and semiconductor lead frame processes.

Subject matter disclosed but not claimed in this application is disclosed and is being claimed in my copending application for U.S. Pat. bearing Ser. No. 142,575 and filed on even date herewith.

With this description of the invention in detail, those skilled in the art will appreciate that modifications may be made to the invention without departing from the spirit thereof. Therefore, it is not intended that the scope of the invention be limited to the specific embodiments that have been illustrated and described. Rather, it is intended that the scope of the invention be determined by the scope of the appended claims.

What is claimed is:

1. A process for producing masks on printed circuits by applying a curable dry film of polymeric material to the area of the printed circuit to be protected, wherein the improvement comprises:

(a) forming on a carrier web a curable dry film of polymeric material having an area corresponding to the area of the printed circuit to be protected, said dry film of polymeric material being peelable from said carrier web wherein said carrier web is a polyester strip, and comprising the steps, in forming a succession of substantially indentical and uniformly spaced areas of said dry film of polymeric material on said elongated carrier web, of:

applying a coating of curable polymeric film on said polyester strip;

applying a cover over the polymeric film to form a composite strip;

separating the cover from the composite strip;

die cutting the polymeric film to form uniformly spaced, substantially identical polymeric film strips along the length of said polyester strip, said uniform spaced strips being surrounded by waste polymeric film material;

stripping away the waste polymeric film material thereby leaving uniformly spaced polymeric material film strips on the polyester strip;

reapplying said cover over said polyester strip and the uniformly spaced polymeric strips, said last mentioned cover having a width substantially the same as that of said polyester strip, forming said polyester strip and cover with spaced polymeric material film strips sandwiched therebetween;

removing the cover;

(b) applying the dry film of polymeric material to the printed circuit by conveying the printed circuit beneath the web with the dry film of polymeric material facing the printed circuit and in alignment therewith;

(c) affixing the dry film of polymeric material to the area of the printed circuit to be protected by pressing the carrier web and dry film of polymeric material against the printed circuit by means of an elastomeric pad having a surface region for contacting the carrier web; and (d) peeling the carrier web away from the printed circuit.

2. A process as defined by claim 1 wherein the dry film of polymeric material is heat curable.

3. A process as defined by claim 1 wherein the dry film of polymeric material is light curable.

4. A process as defined by claim 1 wherein the dry film of polymeric material is sensitive to actinic radiation.

5. A process as defined by claim 1 including the further step in affixing the dry film of polymeric material to the printed circuit to be protected of applying heat to the carrier web and dry film of polymeric material subsequent to the pressing thereof against the printed circuit by the elastomeric pad.

6. A process as defined by claim 1 including the further step in forming the dry film of polymeric material on the carrier web of applying a plastic film to the carrier web with the dry film of polymeric material sandwiched therebetween, thereby to allow the carrier web and film composite structure to be wound up in a roll to facilitate handling, and the further step in applying the dry film of polymeric material to the printed circuit of peeling the plastic film away from the carrier web and dry film of polymeric material.

7. A process as defined by claim 6 wherein the carrier web is made of polyester and the plastic film is made of polyethylene.

8. A process as defined by claim 7 wherein the dry film of polymeric material is photosensitive.

9. A process for producing masks on each of a succession of printed circuits by applying a curable film of polymeric material to each of the areas of the printed circuits to be protected wherein the improvement comprises:

(a) forming a succession of substantially identical and uniformly spaced areas of a film of polymeric material on an elongated carrier web, each of said areas of film of polymeric material corresponding to the areas of the printed circuits to be protected wherein said elongated carrier web is a polyester strip and comprising the steps in forming a succession of substantially identical and uniformly spaced areas of said film of polymeric material on said elongated carrier web, of:

applying a coating of curable polymeric film on said polyester strip, applying a cover over the polymeric film to form a composite strip, separating the cover from the composite strip, die cutting the polymeric film to form uniformly spaced, substantially identical polymeric film strips along the length of said polyester strip, said uniformly spaced strips being surrounded by waste polymeric film material, stripping away the waste polymeric film material thereby leaving uniformly spaced polymeric material film strips on the polyester strip, reapplying said cover over said polyester strip and the uniformly spaced polymeric strip, said last mentioned cover having a width substantially the same as that of said polyester strip forming said polyester strip and cover with spaced polymeric material film strips sandwiched therebetween;

removing the cover;

(b) applying, in succession, each of the areas of film of polymeric material to an individually associated one of the printed circuits by conveying each of the printed circuits into operative relation with the carrier web and relatively moving the carrier web and each such printed circuit to bring an area of film of polymeric material into alignment with the area of each such printed circuit to be protected;

(c) affixing the area of film of polymeric material so aligned to the area of the printed circuit then in operative relation therewith by pressing the carrier web and film of polymeric material against the printed circuit by means of an elastomeric pad having a surface region for contacting the carrier web, and (d) peeling the carrier web away from each such printed circuit, in turn.

10. A process as defined by claim 9 wherein the dry film of polymeric material is heat curable.

11. A process as defined by claim 9 wherein the dry film of polymeric material is light curable.

12. A process as defined by claim 9 wherein the dry film of polymeric material is sensitive to actinic radiation.

13. A process as defined by claim 9 including the further step in affixing the area of film of polymeric material to the area of the printed circuit then in operative relation therewith of applying heat to the carrier web and film of polymeric material subsequent to the pressing thereof against the printed circuit by the elastomeric pad.

14. A process as defined by claim 9 including the further step in forming a succession of substantially identical and uniformly spaced areas of a film of polymeric material on an elongated carrier web of applying a plastic film to the carrier web with the film of polymeric material sandwiched therebetween, thereby to allow the carrier web and film composite structure to be wound up in a roll to facilitate handling, and the further step in applying the film of polymeric material to each of the printed circuits of peeling the plastic film away from the carrier web and film of polymeric material.

15. A process as defined by claim 14 wherein the carrier web is made of polyester and the plastic film is made of polyethylene.

16. A process as defined by claim 15 wherein the film of polymeric material is photosensitive.

17. A process as defined by claim 9 wherein the film of polymeric material is a heat curable film and the succession of spaced areas thereof on the carrier web are formed thereon by the known silk-screen process.

18. A process as defined by claim 9 wherein the film of polymeric material is heat curable film and the succession of spaced areas thereof on the carrier web is formed thereon by printing.

* * * * *